(12) United States Patent
Kalnitsky et al.

(10) Patent No.: US 9,178,080 B2
(45) Date of Patent: Nov. 3, 2015

(54) DEEP TRENCH STRUCTURE FOR HIGH DENSITY CAPACITOR

(71) Applicant: Taiwan Semiconductor Manufacturing Co., Ltd., Hsin-Chu (TW)

(72) Inventors: Alex Kalnitsky, San Francisco, CA (US); Felix Ying-Kit Tsui, Cupertino, CA (US); Hsin-Li Cheng, Hsin Chu (TW); Jing-Hwang Yang, Zhubei (TW); Jyun-Ying Lin, Wujie Township, TN (US)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 47 days.

(21) Appl. No.: 13/685,029

(22) Filed: Nov. 26, 2012

(65) Prior Publication Data
US 2014/0145299 A1   May 29, 2014

(51) Int. Cl.
*H01L 29/94*   (2006.01)
*H01L 49/02*   (2006.01)

(52) U.S. Cl.
CPC .............. *H01L 29/945* (2013.01); *H01L 28/91* (2013.01)

(58) Field of Classification Search
CPC .................. H01L 27/10825; H01L 27/10855; H01L 23/481; H01L 21/768; H01L 23/642; H01L 27/101; H01L 27/10811

USPC .......... 257/532, 295, 296, E27.016, 305, 301, 257/534; 438/386
See application file for complete search history.

(56) References Cited

U.S. PATENT DOCUMENTS

| 6,936,877 | B2 | 8/2005 | Klee et al. | |
| 2001/0025973 | A1* | 10/2001 | Yamada et al. | 257/296 |
| 2003/0008469 | A1* | 1/2003 | Hwang et al. | 438/396 |
| 2008/0185626 | A1* | 8/2008 | Cheng | 257/301 |
| 2013/0161792 | A1* | 6/2013 | Tran et al. | 257/534 |

* cited by examiner

*Primary Examiner* — Cathy N Lam
(74) *Attorney, Agent, or Firm* — Eschweiler & Associates, LLC

(57) ABSTRACT

Some embodiments relate to high density capacitor structures. Some embodiments include a semiconductor substrate having an conductive region with a plurality of trenches formed therein. A first dielectric layer is formed over respective bottom portions and respective sidewall portions of the respective trenches. A first conductive layer is formed in the trench and over the first dielectric layer, wherein the first dielectric layer acts as a first capacitor dielectric between the conductive region and the first conductive layer. A second dielectric layer is formed in the trench and over the first conductive layer. A second conductive layer is formed in the trench and over the second dielectric layer, wherein the second dielectric layer acts as a second capacitor dielectric between the first conductive layer and the second conductive layer. Other embodiments are also disclosed.

20 Claims, 11 Drawing Sheets

DEEP TRENCH STRUCTURE FOR HIGH DENSITY CAPACITOR

BACKGROUND

Capacitors are used for a myriad of purposes on modern integrated circuits. For example, decoupling capacitors are used to decouple one part of an electrical circuit, such as interconnect, from another part of the circuit. In such a configuration, noise arising from the interconnect can be shunted through a decoupling capacitor to reduce the effects of interconnect noise on the remainder of the circuit. Since such capacitors are often placed close to the circuit to eliminate parasitic inductances and resistances associated with the interconnect, there is a need to create a high density capacitor in either the IC technology of interest or in a stand alone process that results in an integrated capacitor device easily mountable on the IC.

DETAILED DESCRIPTION

Figure 1A:
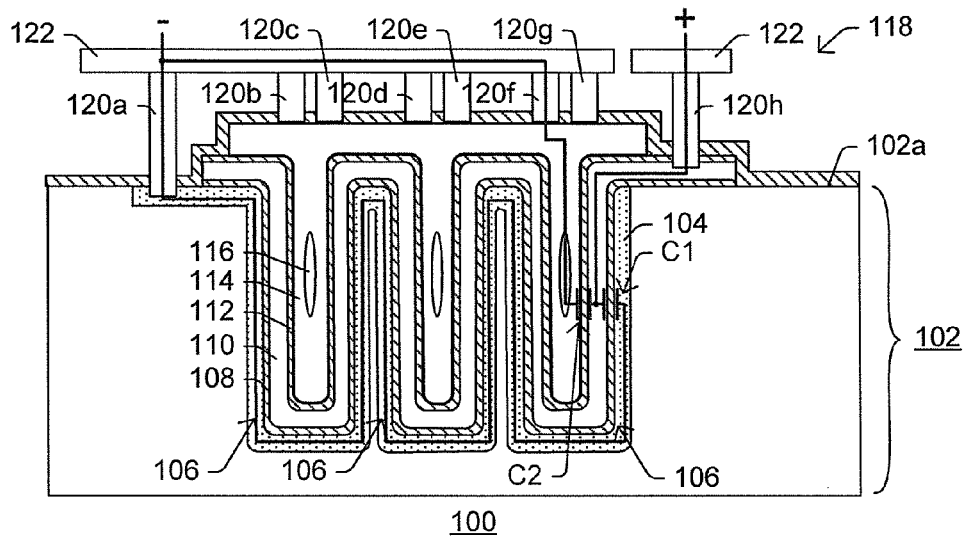
FIG. 1A shows a cross-sectional view illustrating some embodiments of an integrated circuit having a high density capacitor formed thereon.

One or more implementations of the present invention will now be described with reference to the attached drawings, wherein like reference numerals are used to refer to like elements throughout. The drawings are not drawn to scale.

As will be appreciated further herein, the present disclosure relates to improved techniques for high-density capacitors, which are formed in an integrated circuit process or in a stand-alone technology for subsequent wafer level or chip level interconnect between an IC and a capacitor chip. In these high density capacitors, two or more deep trench capacitors are "stacked" over one another and are coupled in parallel to increase capacitance density, relative to conventional implementations. Although several examples are illustrated and described below, these examples do not in any way limit the scope of the present disclosure. A two capacitor stack formation is shown for clarity and simplicity of the illustration.

FIG. 1A shows a cross-sectional view of a high density capacitor 100 formed on an integrated circuit (IC) in accordance with some embodiments. The capacitor 100 is formed on a semiconductor substrate 102, which is often a silicon wafer having a first conductivity type (e.g., n–). A highly doped conductive region 104, which often has a second conductivity type (e.g., p++) is formed within the substrate 102, and a number of trenches 106 extend downward from a substrate upper surface 102a into the conductive region 104. Alternatively, if the only required component of this integrated circuit is a capacitor that does not require capacitor to capacitor isolation (i.e., one plate of all capacitors can operate at the same potential), a heavily doped P++ or N++ wafer can be used to reduce the cost associated with the formation of the conductive region 104. A first dielectric layer 108 is formed in the respective trenches 106 and a first conductive layer 110 (e.g., a first polysilicon layer) is formed over the first dielectric layer 108. A second dielectric layer 112 is formed in the trenches 106 and over the first conductive layer 110, and a second conductive layer 114 is formed in the trenches 106 and over the second dielectric layer 112. Due to the high aspect ratio of the trenches 106, the second conductive layer 114 often includes gaps or voids 116 in the respective trenches.

An interconnect structure 118, which includes contacts (e.g., 120a-120h) and a metal1 layer 122 in the illustrated example, couples the conductive region 104 to the second conductive layer 114. In this way, the interconnect structure 118 couples a first capacitor, C1 (which has conductive plates 104, 110 separated by the first dielectric layer 108), in parallel with a second capacitor, C2 (which has conductive plates 110, 114 separated by the second dielectric layer 112). Thus, FIG. 1A's high density capacitor 100 includes two capacitors C1, C2, which are "stacked" over one another and which are coupled in parallel to increase the capacitance density, relative to conventional implementations. See also FIG. 1B (illustrating an equivalent circuit for FIG. 1A's capacitor.)

Figure 1B:
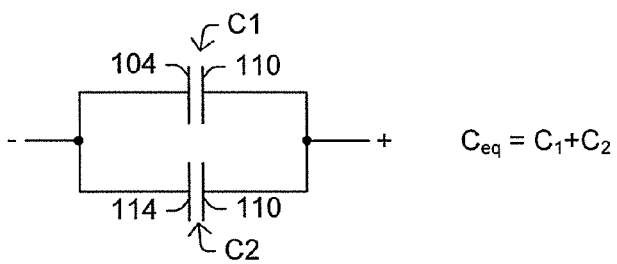
FIG. 1B shows an approximate equivalent circuit schematic corresponding to the high density capacitor of FIG. 1A.
Figure 1C:
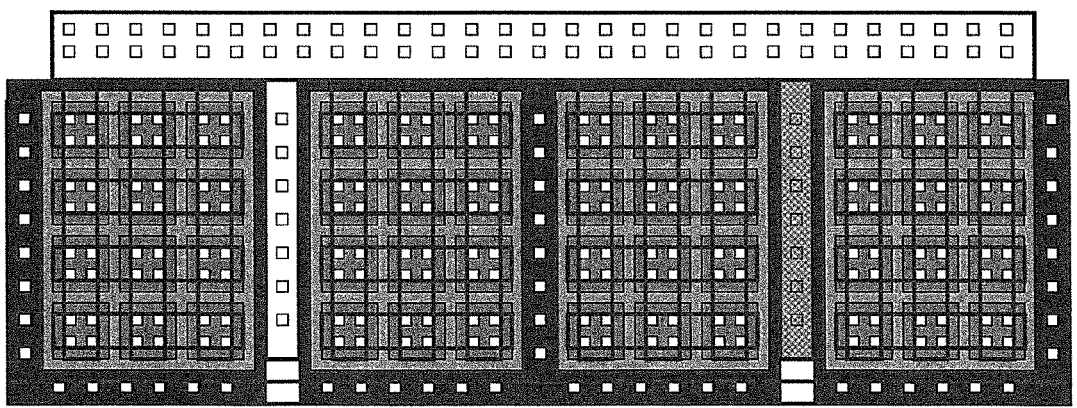
FIG. 1C shows a top view illustrating some embodiments of an integrated circuit having a high density capacitor formed thereon, corresponding to FIG. 1A.

FIG. 1C shows a top view of the capacitor 100, wherein the trenches underlying the capacitors are arranged in an array 150 of rows and columns, and wherein a single capacitor spans multiple rows and columns.

In FIGS. 1A-1C, the capacitance of each of the first and second capacitors C1, C2 is defined as:

$$C_i = \varepsilon_{ri}\varepsilon_0 \frac{A_i}{d_i}$$

Where i=1 for the first capacitor, and i=2 for the second capacitor; $A_i$ is the area of overlap of the conductive capacitor plates for the respective capacitors; $\varepsilon_{ri}$ is the relative static permittivity of the material between the plates for the respective capacitors; $\varepsilon_0$ is the electric constant ($\varepsilon_0 \approx 8.854 \times 10^{-12}$ F m$^{-1}$); and $d_i$ is the distance separating the conductive capacitor plates for the respective capacitors.

In FIG. 1A's embodiment, the geometry due to ridges or pillars defined between neighboring trenches 106 provides an increased amount of area (A) for the first and second capacitors C1, C2 (relative to planar capacitors or capacitors with only a single trench), which tends to provide an increased capacitance. Further, using relatively thin first and second dielectric layers 108, 112 tends to reduce $d_i$, which also tends to increase the capacitance. Lastly, the fact that the interconnect structure 1108 couples the first capacitor $C_1$ in parallel with the second capacitor $C_2$ also increases the effective capacitance of the capacitor 100. This is because the capacitances of capacitors arranged in parallel add together (e.g., $C_{eq}=C_1+C_2$). Because of these factors, FIG. 1A's structure offers a high density capacitor layout, relative to conventional solutions.

Figure 2:
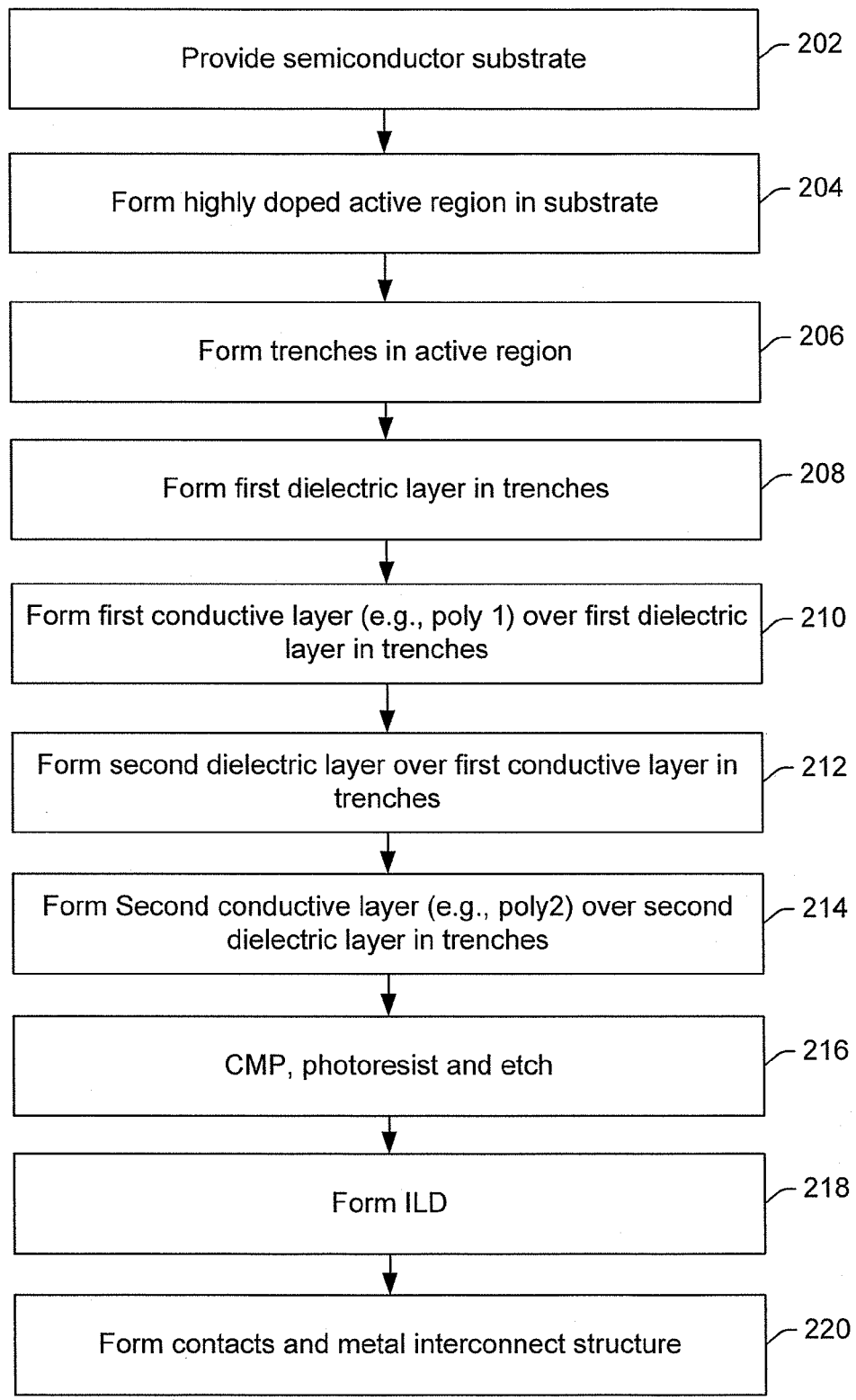
FIG. 2 is a flow-chart illustrating some embodiments of a methodology for manufacturing a high density capacitor.

FIG. 2 is a flow-chart illustrating an example method for manufacturing FIG. 1's capacitor, while FIGS. 3-11 (discussed further herein) show a series of cross-sectional views that collectively illustrate an example method for manufacturing FIG. 1's capacitor. These manufacturing methods are now described below. It will be appreciated that, for purposes of simplicity and readability, some steps may be omitted from what is illustrated and described below, and that other steps may be used in addition to (or in place of) those illustrated and described below.

FIG. 2's method 200 starts at 202, where a semiconductor substrate is provided. In 204, a highly doped conductive region is formed in the substrate. The highly doped conductive region will act as a lower capacitor plate for a first capacitive element. In 206, a number of trenches are formed in the conductive region. (Note that in alternative embodiments blocks 204 and 206 are transposed with one another.) In 208, a first dielectric layer, which will act as a dielectric for the first capacitive element, is formed. In 210, a first conductive layer, such as a poly1 layer for example, is formed over the first dielectric layer in the trenches. In 212, a second conductive layer is formed over the second dielectric layer in the trenches. In 214, a second conductive layer, such as a poly2 layer, is formed in the trenches. In 216, chemical mechanical polishing (CMP) is carried out, photoresist mask (and/or other mask) is provided over the planarized workpiece and is patterned, and an etch is carried out with the mask in place. In 218, an inter-level dielectric is formed, after which contacts and metal interconnect are formed in 220. In this way, the method 200 forms first and second trench capacitors that are stacked on top of one another and arranged in parallel with one another.

Figure 3:
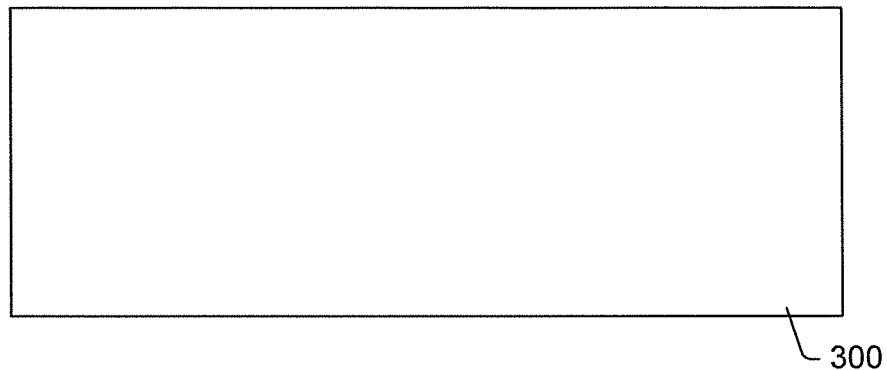
FIGS. 3-11 are a series of cross-sectional views that collectively illustrate some embodiments of a methodology for manufacturing a high density capacitor.

FIGS. 3-11 show other embodiments for methods of manufacturing a high density capacitor. The method starts with reference to FIG. 3, where a semiconductor substrate 300 is provided. In FIG. 3's illustrated embodiment, the substrate 300 can be a bulk semiconductor wafer having a first conductivity type at a first doping concentration. For example, substrate can be a silicon wafer that is lightly doped with a p-type dopant, or can be heavily doped with a p-type dopant. The substrate can be implemented as a bulk silicon wafer substrate, a binary compound substrate (e.g., GaAs wafer), a ternary compound substrate (e.g., AlGaAs), or higher order compound wafers, among others. Further, the semiconductor substrate 202 can also include non semiconductor materials such as oxide in silicon-on-insulator (SOI), partial SOI substrate, polysilicon, amorphous silicon, or organic materials, among others. In some embodiments, the semiconductor substrate 202 can include multiple wafers or dies which are stacked or otherwise adhered together. The semiconductor substrate 202 can include wafers which are cut from a silicon ingot, and/or any other type of semiconductor/non-semiconductor and/or deposited or grown (e.g. epitaxial) layers formed on an underlying substrate.

Figure 4:
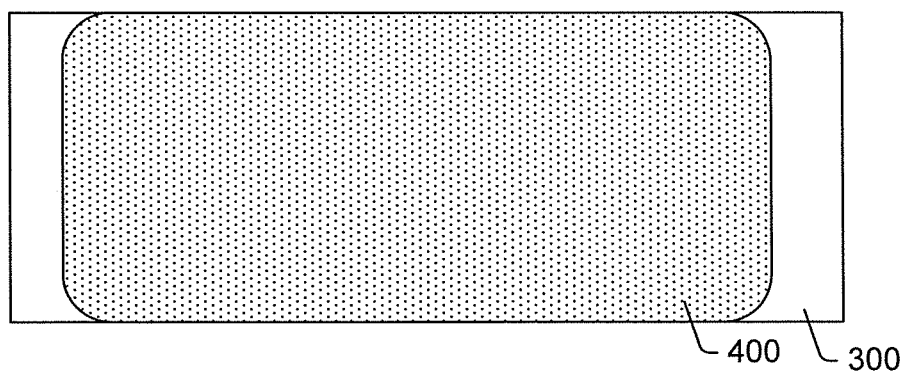

In FIG. 4 a highly doped, conductive region 400 is formed in the substrate 300. The conductive region 400 has a second doping type that is opposite the first doping type. For example, the highly doped conductive region can be an n-type region having a doping concentration ranging from about $1E19$ cm$^{-3}$ to about $1E21$ cm$^{-3}$. In some embodiments, the conductive region 400 is formed by providing a mask (not shown) over the substrate 300, and directing a beam of ions toward the masked substrate. The mask blocks ions or diffusion species from entering the substrate, whereas ions or diffusion species pass through an opening in the mask to form the conductive region. In other embodiments the conductive region can be formed using a POCL3 doping method or some other doping method, rather than ion implantion.

Figure 5A:
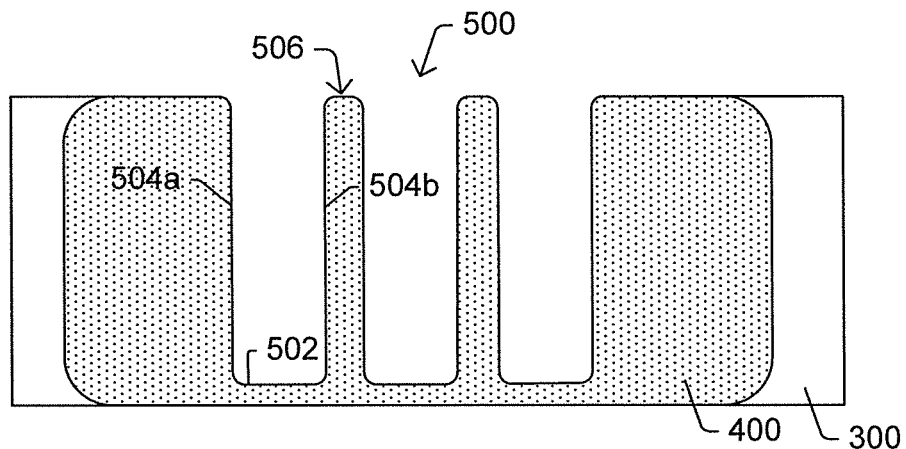

In FIG. 5A, a plurality of trenches 500 are formed in the conductive region 400. The trenches 500 have respective bottom portions 502 and respective sidewall surfaces 504a, 504b, and pillars or ridges 506 are arranged between neighboring trenches. The trenches 500 can each have a width-to-depth aspect ratio of approximately 1:20 in some embodiments. For example, a trench can be approximately 1.2 um wide and approximately 22 um deep in some embodiments. In other embodiments, the width to depth ratio can range from approximately 1000 (deep and narrow trenches) to approximately 1 (shallow and wide trenches), although deep and narrow trenches tend to provide denser capacitor layouts. The trenches 500 are formed by providing trench mask (not shown), and carrying out an etch (e.g., a plasma etch) with the trench mask in place. The trench mask can be a photoresist mask or hard mask, such as an oxide or a nitride mask for example, among others.

Figure 5B:
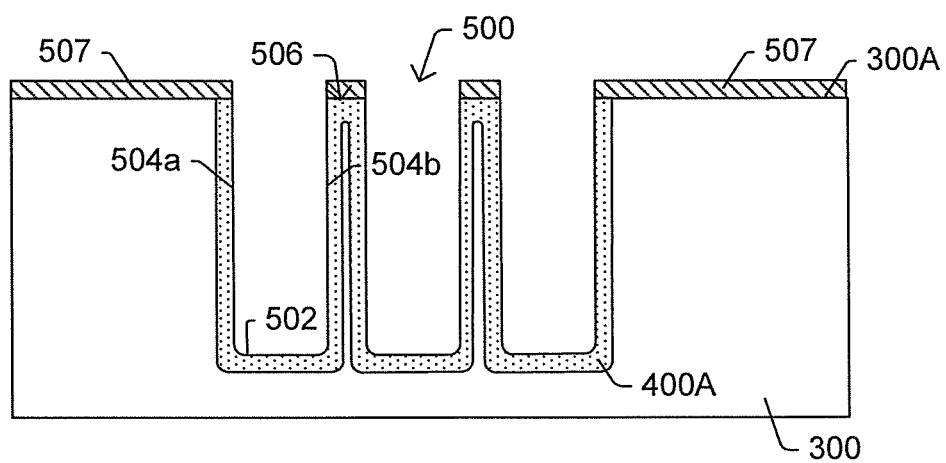

FIG. 5B shows an alternative processing embodiment consistent with the structural implementation previously illustrated in FIG. 1. This alternative process can be utilized when the trenches are more than a few microns deep, which makes formation of the conductive region by diffusion of doping species from the upper substrate surface as described in FIG. 5A impractical. Therefore, FIG. 5B's alternative process starts formation of a deep trench hard mask 507 over upper substrate surface 300A. With the deep trench hard mask 507 in place, an etch is carried out to form trenches 500. After the trenches 500 have been formed and with the deep trench hard mask 507 still in place, N-type doping species are diffused through the deep trench bottom 502 and deep trench sidewalls 504a, 504b using the remaining deep trench etch hard mask 507 as a doping mask. As depicted, the resulting conductive region 400A has a geometry that follows the contours of the trenches 500. FIG. 5B is a preferred embodiment for an IC that contains capacitors as well as other components, such as diodes, transistors, etc. on the same die. High dose of the N+ dopant can be introduced by a POCL3 process, an exposure to PH3 at high temperature, or other techniques. This process allows for formation of junction isolated capacitor structures where each plate of each capacitor can be biased individually. P+ dopants could also be used. For simplicity, the remaining cross-sections are depicted to be consistent with FIG. 5A, however, it will be appreciated that FIG. 5B's implementation could also be carried forward in a similar manner.

Figure 6:
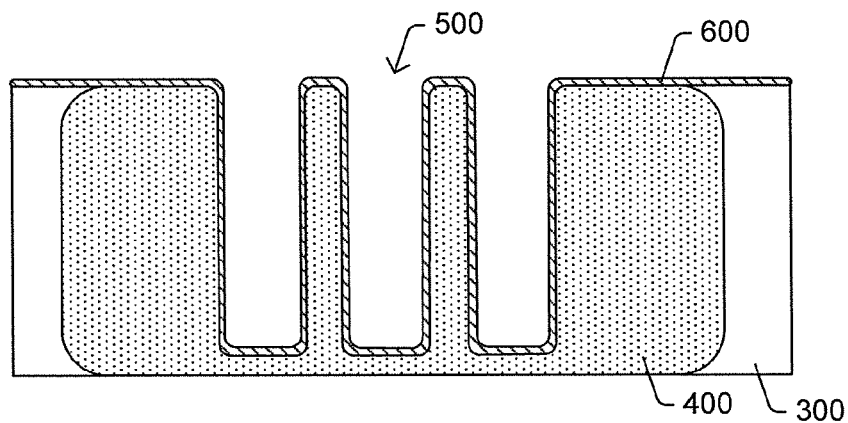

In FIG. 6, a first dielectric layer 600 is formed over the respective sidewalls and bottom portions of the trenches 500. In some embodiments, the dielectric layer 600 is formed directly and conformally over the sidewalls and bottom surfaces of the trenches 500, although other layers (e.g., liners) can also be arranged between dielectric layer 600 and the trench surfaces in other implementations. To form the first dielectric layer 600 within the trenches, a well known three step process can be used to achieve consistent conformal deposition over the workpiece features. In a first step, a thermal oxidation can be carried out to form a thin oxide layer. In second step, a low pressure chemical vapor deposition (CVD) is provided to form a nitride layer over the oxide layer. In a third step, another oxidation step is carried out, such that the first dielectric layer 600 can be an oxide-nitride-oxide (ONO) structure. In some embodiments the dielectric layer 600 can have a dielectric constant ranging between 3 and 1000, with some embodiments having a dielectric constant of approximately 20, although other values are also possible. Dielectrics such as metal oxides, or high K dielectrics can be used. Examples of these include HfO, Al2O3, ZrO, Ta2O5 and others.

Figure 7:
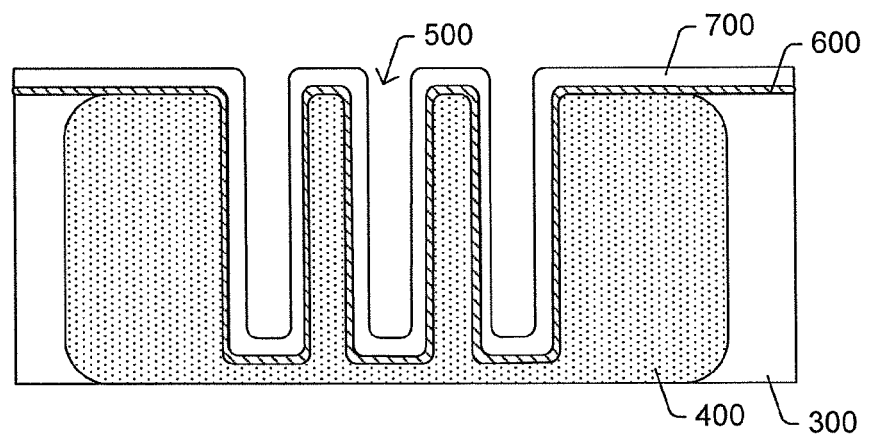

In FIG. 7, a first conductive layer 700, such as a poly1 layer is formed over the first dielectric layer 600. Often, the first conductive layer 700 is formed by in-situ doped low-pressure CVD. In other embodiments, the first conductive layer 700 can also be formed of conductive materials other than polysilicon, such as metal for example.

Figure 8:
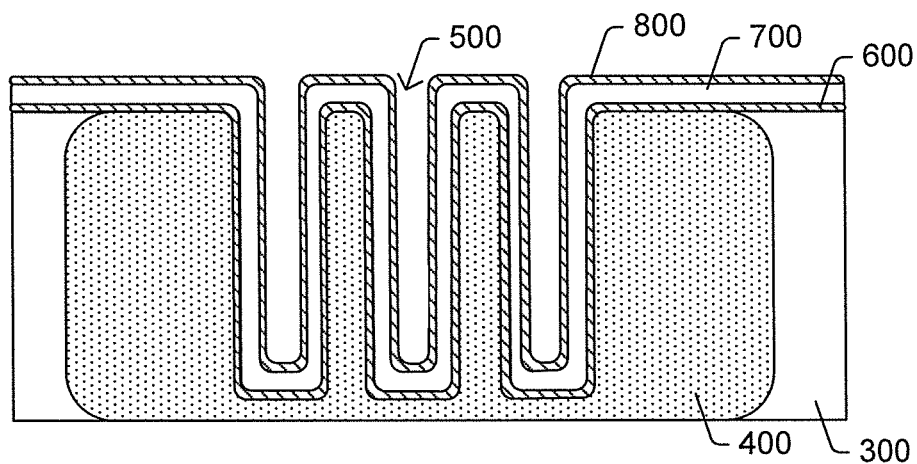

In FIG. 8, a second dielectric layer 800 is formed in the trenches 500 over the first conductive layer 700. In some embodiments, the second dielectric layer 800 is formed directly and conformally over inner sidewalls and bottom surfaces of the first conductive layer 700, although other layers (e.g., liners) can also be arranged between second dielectric layer 800 and first conductive layer 700 in other implementations. The second dielectric layer 800 may have a thickness of approximately 20 to 1000 Angstroms, and can be made of ONO in some embodiments and formed as described with respect to FIG. 6 above. In some embodiments the second dielectric layer 800 can have a dielectric constant ranging between 3 and 1000, with some embodiments having a dielectric constant of approximately 20, although other values are also possible.

Figure 9:
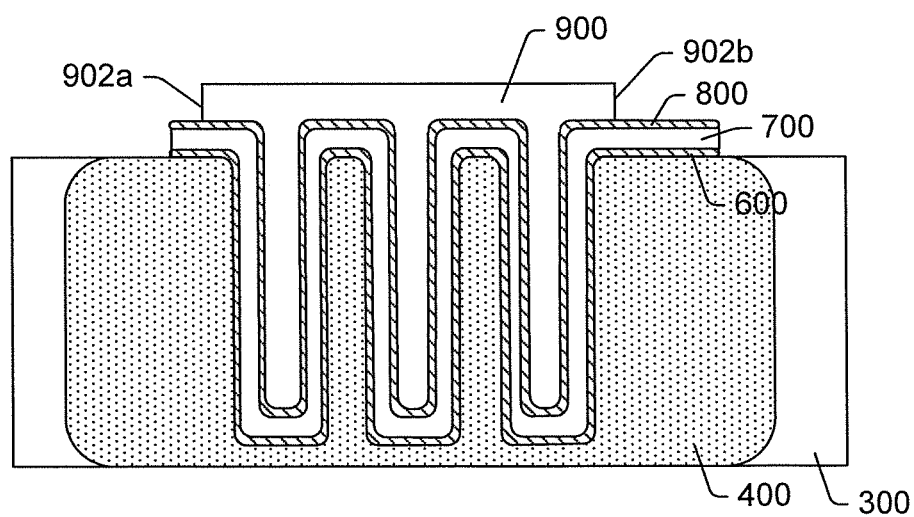

In FIG. 9, a second conductive layer 900, such as a poly2 layer is formed over the second dielectric layer 800. Often, the second conductive layer 900 is formed by in-situ doped low-pressure CVD. In other embodiments, the second conductive layer 900 can also be formed of conductive materials other than polysilicon, such as metal for example. When high aspect ratio trenches are used, gaps or voids may be present in the second conductive layer within the trenches. These gaps or voids are largely an artifact of the manufacturing process as a practical matter, although it may be possible to limit or eliminate them in some situations. After the second conductive layer 900 is formed, a photoresist mask (not shown) or other mask in formed, and an etch is carried out with the mask in place to form sidewalls 902a, 902b.

Figure 10:
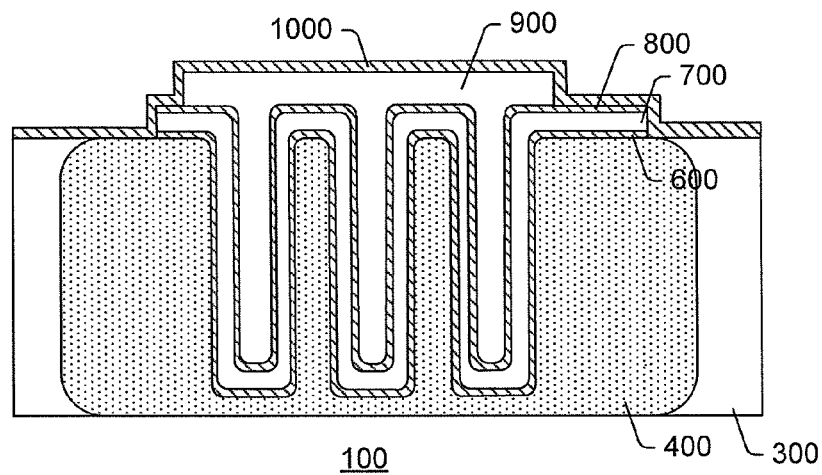

In FIG. 10, an inter-level dielectric (ILD) 1000 is formed over the workpiece. In some embodiments, the ILD 1000 has a thickness of approximately 1000 angstroms and a dielectric constant ranging from approximately 3.0 to approximately 8.5, although other thicknesses and dielectric constants could also be used.

Figure 11:
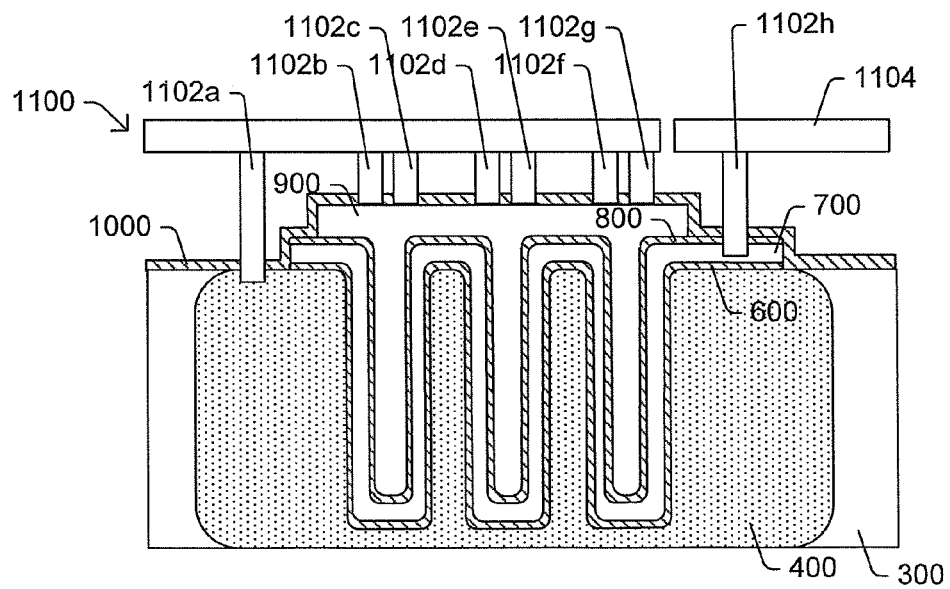

In FIG. 11, an interconnect structure 1100 is formed. The illustrated interconnect structure 1100 includes contacts (e.g., 1102a-1102h) and a metal1 layer 1104 that couple the conductive region 400 to the second conductive layer 1104 to form a high density capacitor that is made up of first and second stacked capacitors. Rather than the contacts and metal1 layer, other embodiments could include higher level metal layers (and addition to or in place of the illustrated layers) or conductive regions or layers in the semiconductor substrate to coupled conductive region 400 to the second conductive layer 1104.

Figure 12A:
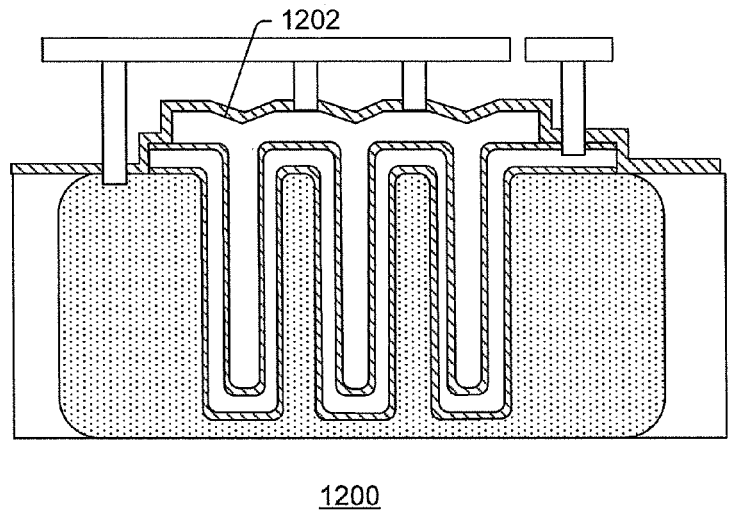
FIG. 12A shows a cross-sectional view illustrating some embodiments of a high density capacitor, which may save a chemical mechanical polishing operation relative to FIG. 1's embodiment.
Figure 12B:
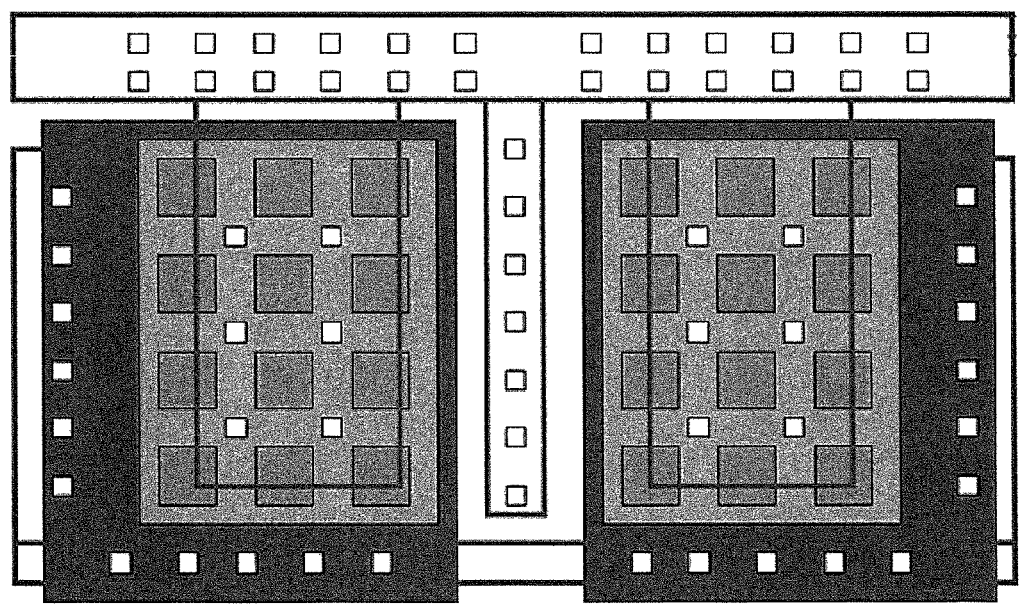
FIG. 12B shows a top view corresponding to FIG. 12A's high density capacitor.

FIG. 12 shows another embodiment of a high density capacitor 1200. The high density capacitor 1200 has many of the same structural features as previously discussed with regards to FIG. 1's capacitor 1000. However, unlike FIG. 1's capacitor where the second conductive layer had a planarized upper surface, FIG. 12's capacitor has an un-planarized upper surface 1202. Also, the contacts are positioned over the ridges or pillars between neighboring trenches in FIG. 12, whereas in FIG. 1 the contacts were positioned over the trenches.

Figure 13:
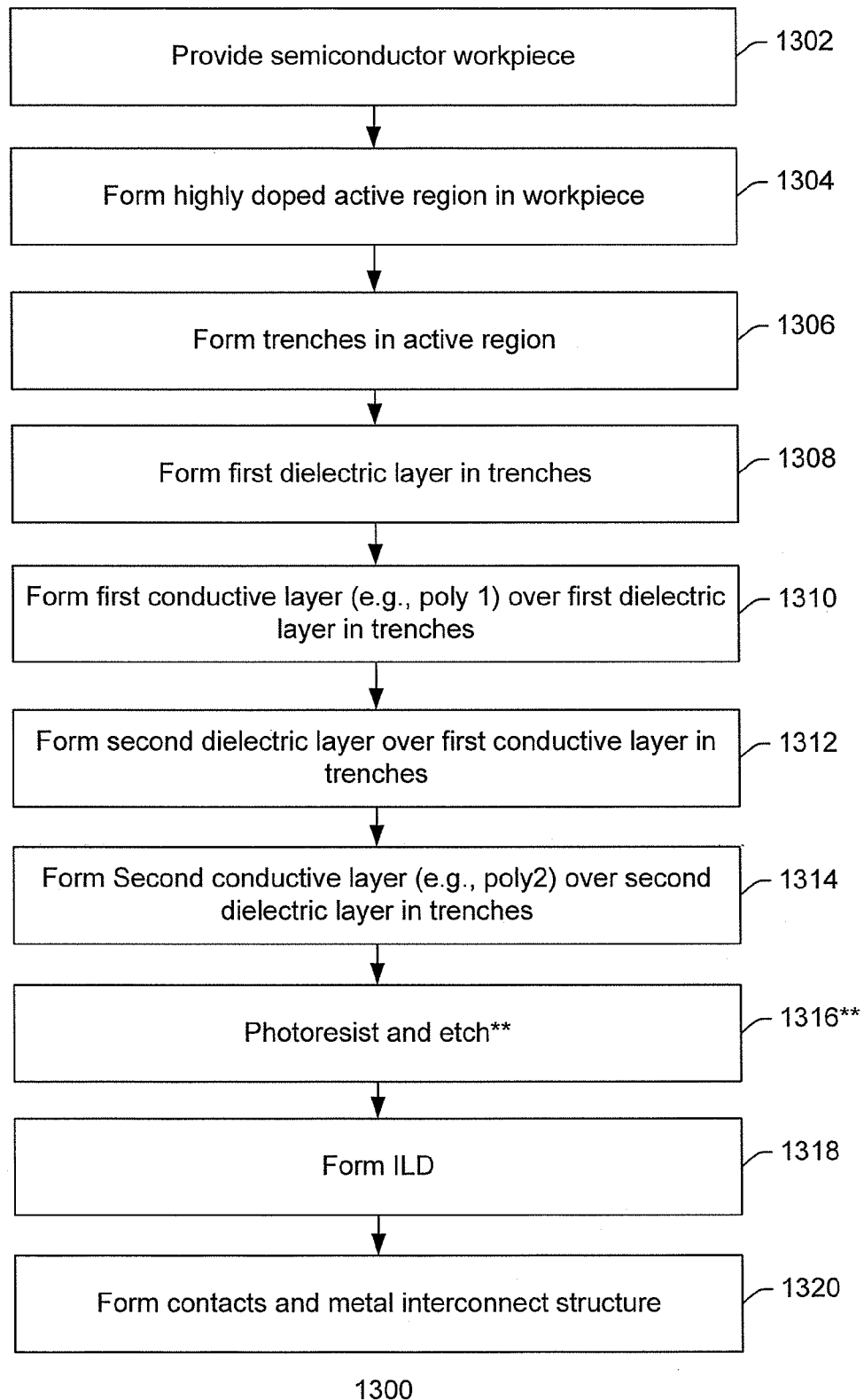
FIG. 13 is a flow-chart illustrating some embodiments of a methodology for manufacturing a high density capacitor.

FIG. 13 shows a method 1300 for manufacturing FIG. 12's capacitor 1200. As can be appreciated by comparing FIG. 13 with FIG. 2 methods (see e.g., block 1316 in FIG. 13 and compare with block 216 in FIG. 2), FIG. 13's manufacturing method eliminates a CMP operation and thereby streamlines manufacturing somewhat.

Figure 14A:
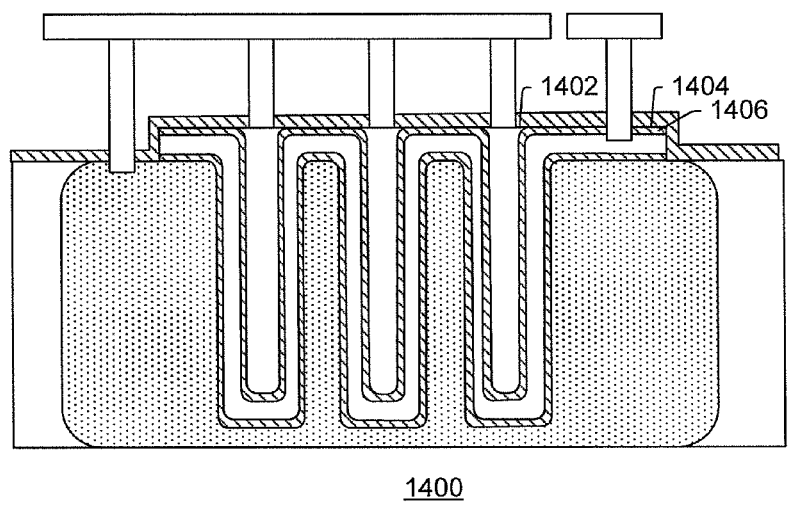
FIG. 14A shows a cross-sectional view illustrating some embodiments of a high density capacitor, which may save a mask operation relative to FIG. 1's embodiment.
Figure 14B:
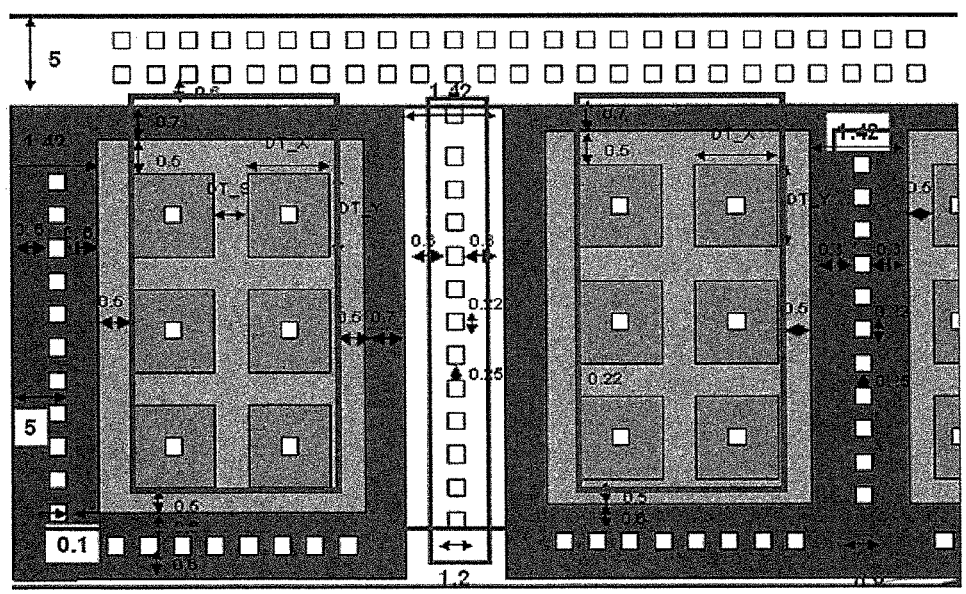
FIG. 14B shows a top view corresponding to FIG. 14A's high density capacitor.

FIG. 14 shows another embodiment of a high density capacitor 1400. The high density capacitor 1400 has many of the same structural features as previously discussed with regards to FIG. 1's capacitor 1000 and FIG. 12's capacitor 1200. However, unlike the previously described capacitors, a second conductive layer upper surface 1402 in FIG. 14's capacitor is planar with adjacent upper surfaces of the second dielectric (1404) or with upper surface of first conductive layer (1406). Contacts are then coupled to the planarized second conductive layer upper surface 1402.

Figure 15:
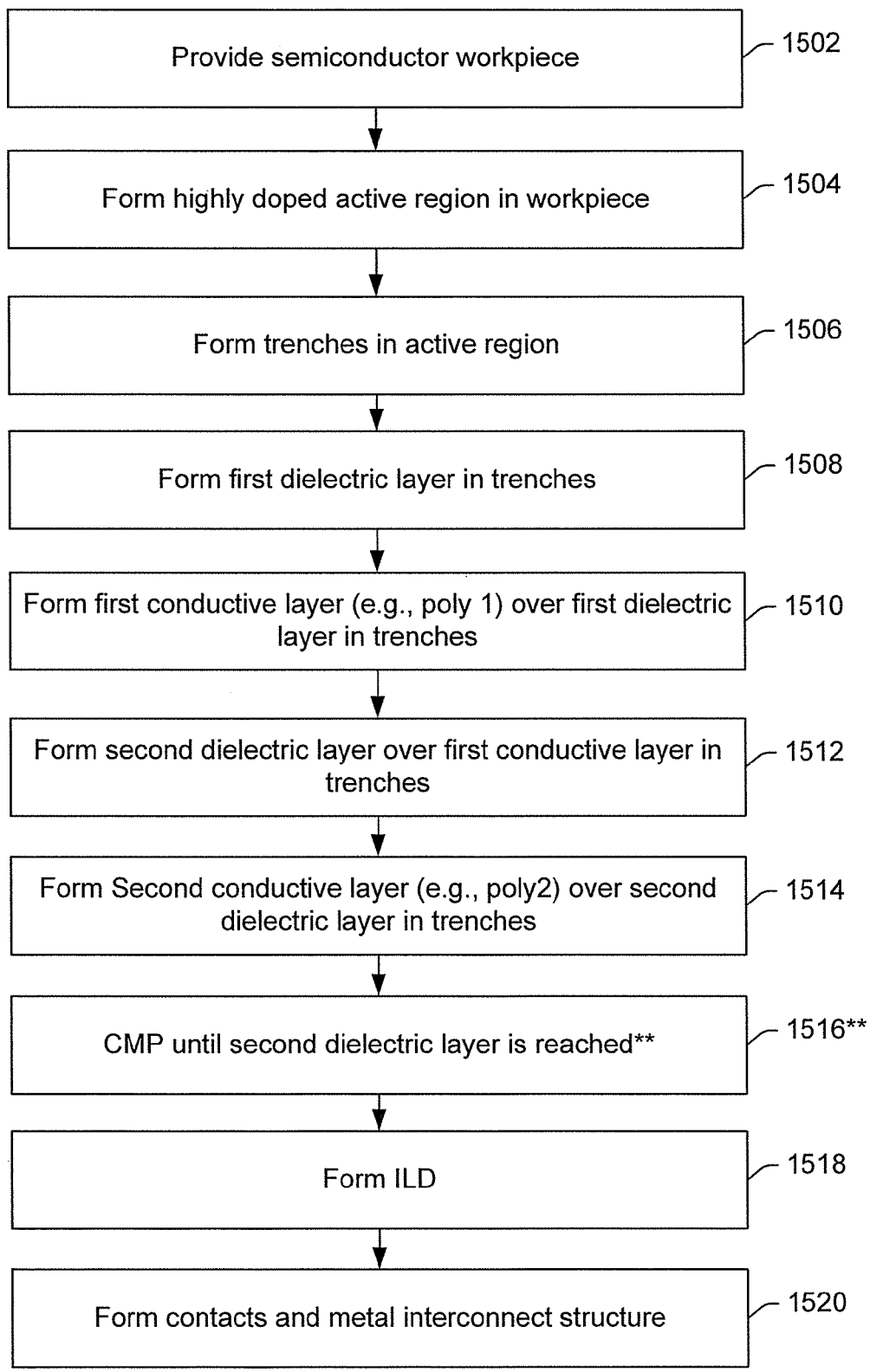
FIG. 15 is a flow-chart illustrating some embodiments of a methodology for manufacturing a high density capacitor.

FIG. 15 shows a method 1500 for manufacturing FIG. 14's capacitor 1400. As can be appreciated by comparing FIG. 15 with FIG. 2, for example, one can see that FIG. 15's manufacturing method eliminates a photolithography step relatively to previous methods (see e.g., block 1516 in FIG. 15 and compare with block 216 in FIG. 2). In eliminating this mask step, FIG. 15's method provides significant cost savings.

Therefore, it will be appreciated that some embodiments relate to an integrated circuit (IC). The IC includes a semiconductor substrate having an conductive region with a plurality of trenches formed therein. The conductive region is formed for example by diffusion of dopant through the exposed side walls and bottoms of deep trenches. A first dielectric layer is formed over respective bottom portions and respective sidewall portions of the plurality of trenches, respectively. A first conductive layer is formed in the trenches and over the first, dielectric layer, wherein the first dielectric layer acts as a first capacitor dielectric between the conductive region and the first conductive layer. A second dielectric layer is formed in the trench and over the first conductive layer. A second conductive layer is formed in the trench and over the second dielectric layer, wherein the second dielectric layer acts as a second capacitor dielectric between the first conductive layer and the second conductive layer.

Other embodiments relate to a method. In the method, an conductive region is formed in a semiconductor substrate, and a plurality of trenches are formed in the conductive region. A first dielectric layer is formed in the plurality of trenches, and a first conductive layer is formed in the plurality of trenches over the first dielectric layer. A second dielectric layer is formed in the plurality of trenches over the first conductive layer, and a second conductive layer is formed in the trenches over the second dielectric layer. An interconnect structure that couples the conductive region to the second conductive layer is formed.

Still other embodiments relate to another method. In this method, an conductive region is formed in a semiconductor substrate, and a plurality of trenches formed in the conductive region. The trenches have respective bottom regions and respective opposing sidewalls, and neighboring trenches are separated from one another by conductive region pillars or ridges. A first dielectric layer is formed in the plurality of trenches. The first dielectric layer conformally extends over the respective bottom regions, respective opposing sidewalls and respective conductive region pillars or ridges. A first conductive layer is formed in the trenches. The first conductive layer extends conformally over the plurality of trenches and over upper surfaces between neighboring trenches. A second dielectric layer is formed in the plurality of trenches. The second dielectric layer conformally extends over the first conductive layer. A second conductive layer is formed in the trenches. The second conductive layer extends conformally over the second dielectric layer. An interconnect structure is formed to couple the conductive region to the second conductive layer.

It will be appreciated that identifiers such as "first" and "second" do not imply any type of ordering or placement with respect to other elements; but rather "first" and "second" and other similar identifiers are just generic identifiers. In addition, it will be appreciated that the term "electrically connected" includes direct and indirect connections. For example, if element "a" is electrically connected to element "b", element "a" can be electrically connected directly to element "b" and/or element "a" can be electrically connected to element "b" through element "c", so long as there is an operable electrical connection between elements "a" and "b".

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. An integrated circuit (IC), comprising:
    a semiconductor substrate having a conductive region therein and having a plurality of trenches formed in the conductive region;
    a first dielectric layer formed over respective bottom portions and respective sidewall portions of the plurality of trenches, respectively;
    a first conductive layer formed in the trenches and over the first dielectric layer, wherein the first dielectric layer acts as a first capacitor dielectric between the conductive region and the first conductive layer;
    a second dielectric layer formed in the trench and over the first conductive layer; and
    a second conductive layer formed in the trench and over the second dielectric layer, wherein the second dielectric layer acts as a second capacitor dielectric between the first conductive layer and the second conductive layer; and
    an interconnect structure providing a direct electrical connection between the conductive region and the second conductive layer.

2. The IC of claim 1, wherein the interconnect structure, in coupling the conductive region to the second conductive layer, couples a first capacitor associated with the first dielectric layer in parallel with a second capacitor associated with the second dielectric layer.

3. The IC of claim 2, wherein the first and second capacitors are each spread over at least two trenches.

4. The IC of claim 1, wherein the second conductive layer includes a gap or void in the trench.

5. The IC of claim 1, wherein the first and second conductive layers are made of polysilicon.

6. The IC of claim 1, wherein the trench has a depth-to-width aspect ratio of 10:1 or greater.

7. The IC of claim 1, wherein an upper surface of the second conductive layer is planarized.

8. The IC of claim 1, wherein an upper surface of the second conductive layer is non-planarized.

9. The IC of claim 1, wherein an upper surface of the second conductive layer is planar with respect to an adjacent upper surface of the second dielectric layer or an adjacent upper surface of the first conductive layer.

10. The IC of claim 1, wherein the conductive region is formed by diffusing dopants through the respective sidewall portions and the respective bottom portions of the respective trenches after the trenches have been formed.

11. The IC of claim 1, wherein the conductive region has a first doping type at a first doping concentration, and the substrate has a second, opposite doping type at a second doping concentration that is less than the first doping concentration.

12. The IC of claim 1, wherein the interconnect structure comprises a plurality of contacts and a metal layer.

13. The IC of claim 1, wherein the interconnect structure includes:
    a horizontal conductive layer extending continuously from over the conductive region to over the second conductive layer;
    a first contact or via extending downward from the horizontal conductive layer to the conductive region and electrically coupling the horizontal conductive layer to the conductive region; and
    a second contact or via extending downward from the horizontal conductive layer to the second conductive layer and electrically coupling the horizontal conductive layer to the second conductive layer.

14. An integrated circuit (IC), comprising:
    a first trench capacitor disposed in at least one trench in a semiconductor substrate;
    a second trench capacitor disposed in the at least one trench in the semiconductor substrate and conformally formed over the first trench capacitor; and
    an interconnect structure coupling the first trench capacitor in parallel with the second trench capacitor.

15. The IC of claim 14, wherein the first trench capacitor comprises:
    a first capacitor plate corresponding to a conductive region formed in the semiconductor substrate where the at least one trench is disposed;
    a first dielectric layer conformally disposed over bottom and sidewall portions of the at least one trench;
    a first conductive layer conformally disposed over the first dielectric layer and in the at least one trench, wherein the first dielectric layer acts as a first capacitor dielectric between the conductive region and the first conductive layer.

16. The IC of claim 15, wherein the second trench capacitor comprises
    a second dielectric layer disposed in the at least one trench and conformally disposed over the first conductive layer;
    a second conductive layer formed in the trench and conformally disposed over the second dielectric layer, wherein the second dielectric layer acts as a second capacitor dielectric between the first conductive layer and the second conductive layer.

17. The IC of claim 16, wherein the second conductive layer includes a gap or void in the trench.

18. The IC of claim 16, wherein an upper surface of the second conductive layer is planarized.

19. The IC of claim 16, wherein the first and second conductive layers are made of polysilicon.

20. The IC of claim 14, wherein the interconnect structure comprises a plurality of contacts and a metal layer.

* * * * *